(12) United States Patent
Kase et al.

(10) Patent No.: US 11,929,402 B2
(45) Date of Patent: Mar. 12, 2024

(54) FIELD-EFFECT TRANSISTOR AND METHOD FOR DESIGNING SAME

(71) Applicant: Novel Crystal Technology, Inc., Saitama (JP)

(72) Inventors: Tadashi Kase, Saitama (JP); Kazuo Aoki, Saitama (JP); Shigenobu Yamakoshi, Saitama (JP); Yuki Uchida, Saitama (JP)

(73) Assignee: Novel Crystal Technology, Inc., Saitama (JP)

( * ) Notice: Subject to any disclaimer, the term of this patent is extended or adjusted under 35 U.S.C. 154(b) by 0 days.

(21) Appl. No.: 17/186,746

(22) Filed: Feb. 26, 2021

(65) Prior Publication Data

US 2021/0273060 A1 Sep. 2, 2021

(30) Foreign Application Priority Data

Feb. 27, 2020 (JP) .................................. 2020-031456

(51) Int. Cl.
*H01L 29/24* (2006.01)
*H01L 29/10* (2006.01)
(Continued)

(52) U.S. Cl.
CPC .......... *H01L 29/24* (2013.01); *H01L 29/1033* (2013.01); *H01L 29/401* (2013.01);
(Continued)

(58) Field of Classification Search
CPC ... H01L 29/24; H01L 29/1033; H01L 29/401; H01L 29/41775; H01L 29/42364;
(Continued)

(56) References Cited

U.S. PATENT DOCUMENTS 4,529,897 A * 7/1985 Suzuki ............... H03K 17/6872
327/437
2017/0018577 A1* 1/2017 Matsuda ............... H01L 29/045
(Continued)

FOREIGN PATENT DOCUMENTS

JP S62-248255 A 10/1987
WO WO 2019/191465 A1 10/2019
(Continued)

OTHER PUBLICATIONS

How much gate-source voltage should be applied to drive the MOSFET? Toshiba (Year: 2022).*
(Continued)

*Primary Examiner* — Mohammad A Rahman
(74) *Attorney, Agent, or Firm* — Scully, Scott, Murphy & Presser, PC

(57) ABSTRACT

A field-effect transistor includes a $Ga_2O_3$-based semiconductor layer, a source region and a drain region that are formed inside the $Ga_2O_3$-based semiconductor layer, a gate electrode that is formed, via a gate insulating film, on a channel region as the $Ga_2O_3$-based semiconductor layer between the source region and the drain region, a source electrode connected to the source region, and a drain electrode connected to the drain region. An interface charge including a negative charge is formed between the gate electrode and the channel region, and a gate threshold voltage is not less than 4.5V.

10 Claims, 8 Drawing Sheets

(51) Int. Cl.
*H01L 29/40* (2006.01)
*H01L 29/417* (2006.01)
*H01L 29/423* (2006.01)
*H01L 29/66* (2006.01)
*H01L 29/78* (2006.01)

(52) U.S. Cl.
CPC .. *H01L 29/41775* (2013.01); *H01L 29/42364* (2013.01); *H01L 29/66674* (2013.01); *H01L 29/7801* (2013.01)

(58) Field of Classification Search
CPC .......... H01L 29/66674; H01L 29/7801; H01L 29/495; H01L 29/51; H01L 29/78; H01L 29/66969; H01L 29/8725; H01L 29/7802; H01L 29/47; H01L 21/02395; H01L 29/20; H01L 29/2006–207; H01L 21/18–326; H01L 31/03046; H01L 31/0735; H01L 31/074; H01L 31/184
See application file for complete search history.

(56) References Cited

U.S. PATENT DOCUMENTS

| | | | |
|---|---|---|---|
| 2018/0068997 A1* | 3/2018 | Jeon | H01L 28/40 |
| 2020/0006551 A1* | 1/2020 | Shi | H01L 29/1095 |
| 2020/0388684 A1* | 12/2020 | Sugimoto | H01L 21/02576 |
| 2021/0013311 A1* | 1/2021 | Sugimoto | H01L 29/24 |

FOREIGN PATENT DOCUMENTS

| | | |
|---|---|---|
| WO | 2020/013259 A1 | 1/2020 |
| WO | 2020/013262 A1 | 1/2020 |

OTHER PUBLICATIONS

Extended European Search Report dated Jul. 5, 2021 from related EP 21159502.0.
Hu, Zongyang et al: "1.6 kV Vertical Ga2O3 FinFETs With Source-Connected Field Plates and Normally-off Operation", May 19, 2019, pp. 483-486, 31st International Symposium on Power Semiconductor Devices and ICS (ISPSD), IEEE.
Bhattacharyya, Arkka et al: "Schottky Barrier Height Engineering in [beta]-Ga2O3 Using SiO2 Interlayer Dielectric", Feb. 14, 2020, pp. 286-294, vol. 8, IEEE Journal of the Electron Devices Society, IEEE.
European Office Action dated May 4, 2023 from related EP 21 159 502.0.
Office Action dated Dec. 26, 2023 received from the Japanese Patent Office in related JP 2020-031456 together with English language translation.

* cited by examiner

FIELD-EFFECT TRANSISTOR AND METHOD FOR DESIGNING SAME

CROSS-REFERENCE TO RELATED APPLICATION

The present patent application claims the priority of Japanese patent application No. 2020/031456 filed on Feb. 27, 2020, and the entire contents of Japanese patent application No. 2020/031456 are hereby incorporated by reference.

TECHNICAL FIELD

The present invention relates to a field-effect transistor and a method for designing the same.

BACKGROUND ART $Ga_2O_3$, which has a very large band gap, has received attention as a semiconductor used for sensor systems operable in a harsh environment such as in a high-temperature environment or in a radiation exposure environment.

It is possible to form n-type $Ga_2O_3$, but under current circumstances, it is difficult to stably realize p-type because of high resistance. For this reason, field-effect transistors using a $Ga_2O_3$-based semiconductor adopt a structure of depletion-mode MOSFET in which a gate insulating film is provided at an interface between a gate metal and a $Ga_2O_3$-based semiconductor layer.

Patent Literature 1 is a prior art document related to the invention of the present application.

CITATION LIST

Patent Literature

Patent Literature 1: WO 2019/191465

SUMMARY OF INVENTION

Due to such a structure, conventional field-effect transistors using a $Ga_2O_3$-based semiconductor operate in the normally-on state. However, in view of replacements for currently used power devices using Si or SiC or in view of safety, normally-off operation is desired. In addition to this, it is desirable to have a gate threshold voltage at the same level as the currently used power devices using Si or SiC to suppress malfunction and to enhance versatility.

It is an object of the invention to provide a highly versatile field-effect transistor that can be used in a high-temperature environment or in a radiation exposure environment and achieves normally-off operation, as well as a method for designing the field-effect transistor.

According to an embodiment of the invention, a field-effect transistor defined in [1] to [10] below, and a method for designing a field-effect transistor defined in [11] and [12] below are provided.

[1] A field-effect transistor, comprising:
  a $Ga_2O_3$-based semiconductor layer;
  a source region and a drain region that are formed inside the $Ga_2O_3$-based semiconductor layer;
  a gate electrode that is formed, via a gate insulating film, on a channel region as the $Ga_2O_3$-based semiconductor layer between the source region and the drain region;
  a source electrode connected to the source region; and
  a drain electrode connected to the drain region,
  wherein an interface charge comprising a negative charge is formed between the gate electrode and the channel region, and a gate threshold voltage is not less than 4.5V.

[2] The field-effect transistor described in [1], wherein a donor carrier concentration in the channel region is not less than $1\times10^{15}$ cm$^{-3}$ and not more than $1\times10^{18}$ cm$^{-3}$.

[3] The field-effect transistor described in [1] or [2], wherein a depth of the channel region is not less than 10 nm and not more than 3 µm.

[4] The field-effect transistor described in any one of [1] to [3], wherein the gate insulating film comprises $Al_2O_3$ and has a thickness of not less than 5 nm and not more than 140 nm.

[5] The field-effect transistor described in any one of [1] to [4], wherein the interface charge is formed in an upper portion of the channel region or at an interface of the channel region with the gate insulating film.

[6] The field-effect transistor described in any one of [1] to [4], wherein the interface charge is formed inside the gate insulating film or at an interface of the gate insulating film with the channel region.

[7] The field-effect transistor described in any one of [1] to [6], further comprising:
  a drift region formed in the $Ga_2O_3$-based semiconductor layer in a region in contact with the channel region and the drain region.

[8] The field-effect transistor according to described in any one of [1] to [7], wherein the $Ga_2O_3$-based semiconductor layer is formed on a substrate that comprises any of $Ga_2O_3$, AlN, SiC, diamond, sapphire, Si, $SiO_2$, $Si_3N_4$ or BN.

[9] A field-effect transistor, comprising:
  a $Ga_2O_3$-based semiconductor layer;
  a source region and a drain region that are formed inside the $Ga_2O_3$-based semiconductor layer;
  a gate electrode that is formed, via a gate insulating film, on a channel region as the $Ga_2O_3$-based semiconductor layer between the source region and the drain region;
  a source electrode connected to the source region; and
  a drain electrode connected to the drain region,
  wherein an interface charge comprising a negative charge is formed between the gate electrode and the channel region, and the field-effect transistor has a gate threshold voltage that is determined taking into consideration at least the interface charge and a thickness and a relative permittivity of the gate insulating film.

[10] The field-effect transistor described [9], wherein the field-effect transistor has a gate threshold voltage that is controlled using at least any one of the thickness of the gate insulating film, the relative permittivity of the gate insulating film, a donor carrier concentration in the channel region, and a channel depth of the channel region.

[11] A method for designing a field-effect transistor comprising a $Ga_2O_3$-based semiconductor layer, a source region and a drain region that are formed inside the $Ga_2O_3$-based semiconductor layer, a gate electrode that is formed, via a gate insulating film, on a channel region as the $Ga_2O_3$-based semiconductor layer between the source region and the drain region, a source electrode connected to the source region, and a drain electrode connected to the drain region, the method comprising:

forming an interface charge comprising a negative charge between the gate electrode and the channel region, and determining a gate threshold voltage taking into consideration at least the interface charge and a thickness and a relative permittivity of the gate insulating film.

[12] The method described in [11], comprising:

controlling a gate threshold voltage using at least any one of the thickness of the gate insulating film, the relative permittivity of the gate insulating film, a donor carrier concentration in the channel region, and a channel depth of the channel region.

Advantageous Effects of the Invention

According to an embodiment of the invention, a highly versatile field-effect transistor can be provided that can be used in a high-temperature environment or in a radiation exposure environment and achieves normally-off operation, as well as a method for designing the field-effect transistor.

DESCRIPTION OF EMBODIMENTS

Embodiment

An embodiment of the invention will be described below in conjunction with the appended drawings.

(General Configuration of a Field-Effect Transistor)

Figure 1A:
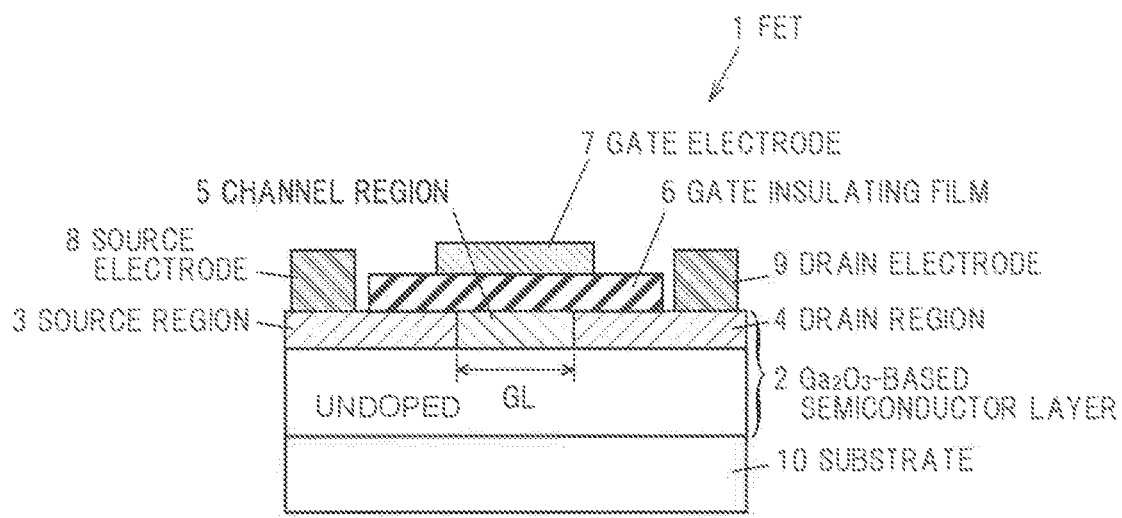
FIG. 1A is a vertical cross-sectional view showing a field-effect transistor (FET) in an embodiment of the present invention.
Figure 1B:
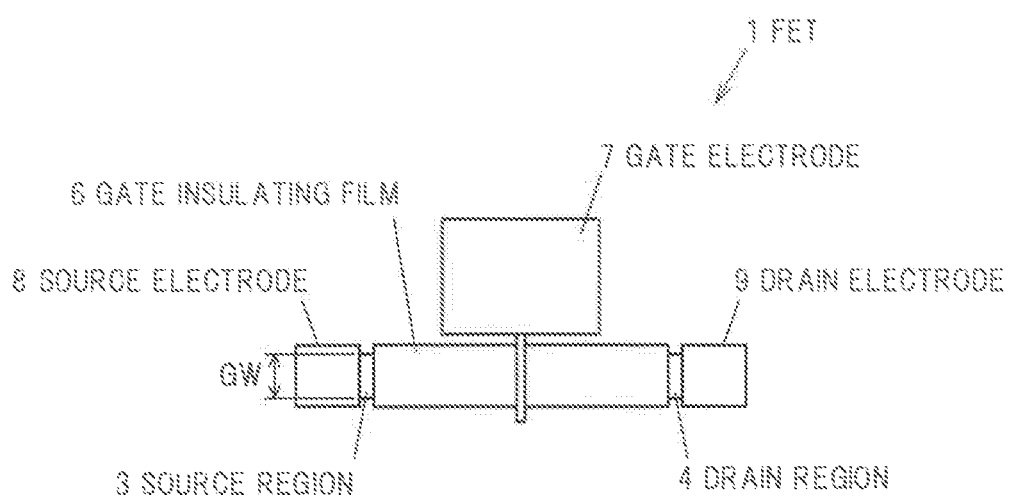
FIG. 1B is a plane view thereof.

FIG. 1A is a vertical cross-sectional view showing a field-effect transistor (FET) in the present embodiment and FIG. 1B is a plane view thereof.

As shown in FIGS. 1A and 1B, a FET 1 includes a $Ga_2O_3$-based semiconductor layer 2, a source region 3 and a drain region 4 that are formed inside the $Ga_2O_3$-based semiconductor layer 2, a gate electrode 7 that is formed, via a gate insulating film 6, on a channel region 5 as the $Ga_2O_3$-based semiconductor layer 2 between the source region 3 and the drain region 4, a source electrode 8 connected to the source region 3, and a drain electrode 9 connected to the drain region 4.

The $Ga_2O_3$-based semiconductor layer 2 is formed of a $Ga_2O_3$-based material that has insulating properties or weak n-type conductivity and the undoped region without the cross hatching typically does not contain any intentionally doped impurity.

The $Ga_2O_3$-based material here is $Ga_2O_3$, or is $Ga_2O_3$ doped with an element such as Al or In, and may be, e.g., $(Ga_xAl_yIn_{(1-x-y)})_2O_3$ ($0<x \le 1$, $0 \le y<1$, $0<x+y \le 1$) which is $Ga_2O_3$ doped with Al and In. The band gap is widened by doping with Al and is narrowed by doping with In.

When the $Ga_2O_3$-based material constituting the $Ga_2O_3$-based semiconductor layer 2 is a single crystal, the $Ga_2O_3$-based semiconductor layer 2 is, e.g., an epitaxial layer that is provided on a substrate 10 formed of a $Ga_2O_3$-based single crystal and is formed by epitaxial growth using the substrate 10 as a underlayer. A crystal structure of the $Ga_2O_3$ single crystal constituting the $Ga_2O_3$-based semiconductor layer 2 is typically a β-type which is a monoclinic crystal system. In the present embodiment, the $Ga_2O_3$-based semiconductor layer 2 is formed by the MBE (Molecular Beam Epitaxy) method or the HYPE (Hydride Vapor Phase Epitaxy) method.

The substrate 10 is, e.g., a substrate formed of a $Ga_2O_3$-based single crystal doped with an acceptor impurity such as Fe or Mg and has an increased resistance due to doping of the acceptor impurity. As compared to Mg, Fe is more preferable as the acceptor impurity for doping the substrate 10 since thermal diffusion in the $Ga_2O_3$-based single crystal is small and it is less likely to diffuse to the channel region and cause a decrease in device performance In this regard, the substrate 10 is not limited to the $Ga_2O_3$-based single crystal and may be formed of, e.g., any of AlN, SiC, diamond, sapphire, Si, $SiO_2$, $Si_3N_4$ (SiN) or BN.

The source region 3 and the drain region 4 are regions doped with an n-type impurity by ion implantation, etc. The source region 3 and the drain region 4 are n-type regions included in the $Ga_2O_3$-based semiconductor layer 2 and are formed of an n-type $Ga_2O_3$-based material. A donor carrier concentration in the source region 3 and the drain region 4 is, e.g., $1 \times 10^{19}$ $cm^{-3}$.

In the FET 1, a region which is continuous between the source region 3 and the drain region 4 and located inside the $Ga_2O_3$-based semiconductor layer 2 at the vicinity of the surface is the channel region 5 in which a channel is formed during operation of the FET 1. The channel region 5 is, e.g., an $n^-$ region doped with an n-type impurity by ion implantation, etc., and has an n-type conductivity that is stronger than an n-type conductivity that an intentionally doped impurity-free region of the $Ga_2O_3$-based semiconductor layer 2 can have, and is weaker than the source region 3 and the drain region 4.

The donor carrier concentration in the channel region 5 should be not less than $1 \times 10^{15}$ $cm^{-3}$ and not more than $1 \times 10^{18}$ $cm^{-3}$. The reason why the donor carrier concentration in the channel region 5 is not less than $1 \times 10^{15}$ $cm^{-3}$ is that it is technically difficult to adjust the donor carrier concentration in the channel region 5 to less than $1\times10^{15}$ cm$^{-3}$. In the present embodiment, a low donor carrier concentration of about $1\times10^{15}$ cm$^{-3}$ can be achieved by forming the Ga$_2$O$_3$-based semiconductor layer 2 using the HYPE method, and this facilitates designing of the FET 1. Meanwhile, the channel depth D which is a depth of the channel region 5 is desirably not less than 10 nm since quantum effects appear when the channel depth D is less than 10 nm. In order to have a gate threshold voltage of not less than 4.5V while having the channel depth of not less than 10 nm, the donor carrier concentration in the channel region 5 needs to be not more than $1\times10^{18}$ cm$^{-3}$.

Furthermore, in order to adjust the donor carrier concentration in the channel region 5 to not less than $1\times10^{15}$ cm$^{-3}$ and also to have gate threshold voltage of not less than 4.5V, the channel depth D needs to be not more than 3 μm. Since the channel depth D is desirably not less than 10 nm to avoid the quantum effects as described above, the channel depth D should be not less than 10 nm and not more than 3 μm.

The gate electrode 7 is formed of, e.g., a metal such as Au, Al, Ti, Sn, Ge, In, Ni, Co, Pt, W, Mo, Cr, Cu, Pt, or an alloy containing two or more of these metals, or a semiconductor containing a high concentration of a dopant. The source electrode 8 and the drain electrode 9 are formed of a conductive material, such as Ti/Au, In, that forms an ohmic contact with the source region 3 and the drain region 4.

The gate insulating film 6 is formed of an insulating material such as SiO$_2$, HfO$_2$, AlN, SiN, Al$_2$O$_3$, β-(Al$_x$Ga$_{1-x}$)$_2$O$_3$ ($0 \leq x \leq 1$). By controlling a thickness and a relative permittivity of the gate insulating film 6, it is possible to control a gate threshold voltage V$_{th}$ of the FET 1. The details of this point will be described later. The gate insulating film 6 is formed by, e.g., ALD (Atomic Layer Deposition) method, etc.

A gate length GL is, e.g., not less than 1.0 μm and not more than 3.0 μm. A gate width GW is, e.g., 200 μm. However, the gate length GL and the gate width GW are not limited thereto and can be appropriately adjusted.

(Realization of Normally-Off Operation and Control of the Gate Threshold Voltage V$_{th}$)

Figure 2:
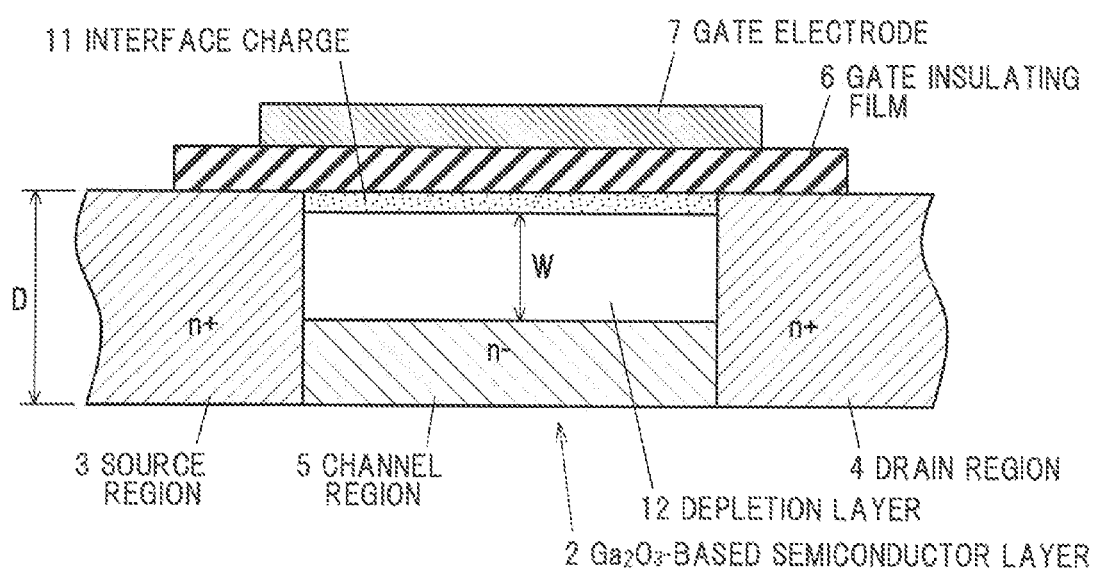
FIG. 2 is an explanatory diagram illustrating operation of the field-effect transistor (PET).

In the FET 1 of the present embodiment, an interface charge 11 consisting of a negative charge is formed between the gate electrode 7 and the channel region 5 as shown in FIG. 2 and the gate threshold voltage V$_{th}$ of not less than 4.5V is realized by taking into consideration the interface charge 11 and an effect of the gate insulating film 6 (the thickness and the relative permittivity). Next, the details of this point will be described in detail.

A depth W of a depletion layer 12 at a gate voltage of 0V is expressed by the following equation (1). When the relation is such that the depth W of the depletion layer 12 is greater than the channel depth D, i.e., when the relation is W>D, the FET 1 is normally-off.

$$W = \sqrt{\frac{2\varepsilon_0 \varepsilon_S V_{FB}}{qN_D}} \quad (1)$$

V$_{FB}$: Gate voltage at which the depth W of the depletion layer is zero
W: Depth of the depletion layer 12
q: Quantity of elementary charge
N$_D$: Donor carrier concentration in the channel region
ε$_s$: Channel relative permittivity
ε$_0$: Vacuum permittivity To obtain flat-band voltage V$_{FB}$ in the equation (1), the following equation (2) is generally used.

$$V_{FB} = \Phi_{MS} + (Q_{it}/C_{ox}) \quad (2)$$

In the equation (2), $\varphi_{MS}$ is a work function potential difference (a difference between a work function of the Ga$_2$O$_3$-based semiconductor layer 2 and a work function of the gate electrode 7), Q$_{it}$ is an effective interface charge per unit area of the interface charge 11, and C$_{ox}$ is capacitance per unit area of the gate insulating film 6.

Regarding $\varphi_{MS}$ in the above equation (2), an effect of the gate insulating film 6 tends to be ignored since the gate insulating film 6 is very thin and conductivity of the depletion layer 12 is immediately inverted to n-type in case that p-type is used for a normal gate. In the FET 1, however, since gate control is performed by only the depth W of the depletion layer 12, capacitance of the gate insulating film 6 is inserted in series with capacitance of the depletion layer 12 and the effect of the gate insulating film 6 cannot be ignored.

Given that, e.g., the interface charge 11 is not present and the gate insulating film 6 is also not present. Then, in case that Ni is used for the gate electrode 7 and when a work function of Ni is 5.2 eV and a work function of the Ga$_2$O$_3$-based semiconductor layer 2 is 4.0 eV, $\varphi_{MS}$ is 1.2V which is V$_{FB}$. The depth of the depletion layer 12 at this time is 51.5 nm. Therefore, when the channel depth D is, e.g., 50.0 nm, it should be normally-off.

However, when the gate insulating film 6 having, e.g., a thickness of 20 nm and a relative permittivity of 8.1 (Al$_2$O$_3$) is present, an equivalent thickness of the gate insulating film 6 when having a Ga$_2$O$_3$ relative permittivity of 10 is 24.7 nm and an equivalent thickness (the channel depth) of Ga$_2$O$_3$ is 50.0+24.7=74.7 nm. Therefore, when the depth of the depletion layer 12 is 51.5 nm as described above, the depletion layer 12 does not reach an end point of the channel region 5 and this results in normally-on. This can be considered equivalent to a decrease in $\varphi_{MS}$. Hereinafter, the equivalent thickness of the gate insulating film 6 when having a Ga$_2$O$_3$ relative permittivity of 10 is referred to as an equivalent dielectric film thickness.

Here, when voltage at which the depth of the depletion layer 12 reaches the equivalent dielectric film thickness (at which the depth of the depletion layer 12 becomes equal to the equivalent dielectric film thickness) is defined as V$_{GAO}$, an equivalent dielectric film thickness t$_{GAO}$ of the gate insulating film 6 can be obtained by the following equation (3).

$$t_{GAO} = \sqrt{\frac{2\varepsilon_S \varepsilon_0 V_{GAO}}{qN_D}} \quad (3)$$

When transforming the equation (3), the following equation (4) is obtained.

$$V_{GAO} = (t_{GAO} q N_D)/(2C_{GAO}) \quad (4)$$

where C$_{GAO}$ is equivalent capacitance per unit area when the gate insulating film 6 has a Ga$_2$O$_3$ relative permittivity of 10.

Taking into consideration V$_{GAO}$ obtained by the equation (4), the present inventors obtained the flat-band voltage V$_{FB}$ using the following equation (5) instead of using the equation (2).

$$V_{FB} = \Phi_{MS} - V_{GAO} + (Q_{it}/C_{ox}) \quad (5)$$

From the equation (5), it is understood that the flat-band voltage $V_{FB}$ decreases due to the effect of the gate insulating film 6.

Figure 3A:
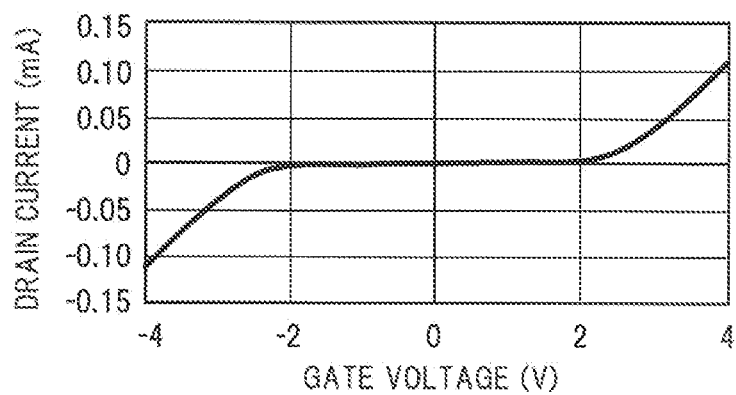
FIG. 3A shows I-V characteristics when the field-effect transistor (FET) of FIG. 1A is formed so that a gate insulating film and a gate electrode are omitted and a channel depth D is 50 nm.
Figure 3B:
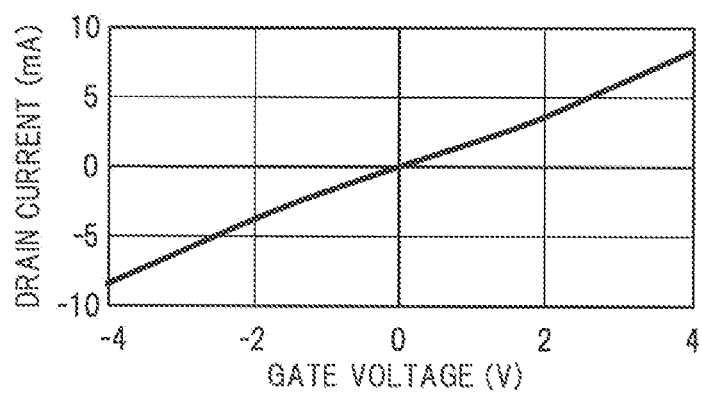
FIG. 3B shows I-V characteristics when the channel depth D is 120 nm.

Next, the interface charge 11 will be examined. It is generally said that when an oxide insulating film is provided on silicon, etc., positive charges are formed at an interface due to oxygen deficiency in the oxide insulating film. The present inventors made and tested FETs configured such that the gate insulating film 6 and the gate electrode 7 are omitted from FIG. 1A and the channel depth D is respectively 50 nm and 120 nm. The donor carrier concentration in the channel region 5 was $5 \times 10^{17}$ cm$^{-3}$ and the gate length GL was 3 μm. As a result, the FET having the channel depth D of 50 nm exhibited normally-off behavior and the FET having the channel depth D of 120 nm exhibited normally-on behavior. In the FET having the channel depth D of 50 nm, a barrier was formed and caused high resistance, and Schottky-like characteristics, which are I-V characteristics shown in FIG. 3A, were obtained. Meanwhile, in the PET having the channel depth D of 120 nm, ohmic characteristics, which are I-V characteristics shown in FIG. 3B, were obtained. In this regard, gate voltage on the horizontal axis in FIGS. 3A and 3B indicates voltage at the upper portion of the channel region 5 (voltage at a position where the gate electrode 7 is provided).

Now, the FET having the channel depth D of 120 nm is examined Since the donor carrier concentration in the channel region 5 is $5 \times 10^{17}$ cm$^{-3}$ and the gate length GL is 3 μm as described above, resistivity ρ should be 0.156 Ω·m from 1/(elementary charge×carrier mobility×carrier concentration) and a resistance value should be 19.5Ω. However, when actually passing a current through the manufactured FET and measuring the resistance value, the measurement result of the resistance value was 1140Ω. From this fact, it can be presumed that the channel is significantly narrowed even though the I-V characteristics are ohmic. The conceivable reason is that the interface charge 11 formed of a negative charge is present at a void-surface interface of Ga$_2$O$_3$ (on a surface or in the upper portion of the channel region 5) and the depletion layer 12 caused by this narrows the channel From this, it is considered that, in the case of Ga$_2$O$_3$, a surface charge (the interface charge 11) of the Ga$_2$O$_3$ itself is more dominant in determining normally-off behavior and its threshold value than the charges by the gate insulating film 6.

Based on the above examination results, the gate threshold voltage $V_{th}$ in the present embodiment is determined in consideration of the presence of the interface charge 11 formed of a negative charge between the gate electrode 7 and the channel region 5 and also in consideration of the thickness and relative permittivity of the gate insulating film 6 ($V_{GAO}$ described above). Although the examination here was carried out using the devices not having the gate insulating film 6 and the gate electrode 7, the gate insulating film 6 and the gate electrode 7 are formed on the channel region 5 in the actual devices. In this case, the interface charge 11 is formed between the gate electrode 7 and the channel region 5. The interface charge 11 in this example is formed in an upper portion of the channel region 5 or at an interface of the channel region 5 with the gate insulating film 6. However, it is not limited thereto and the interface charge 11 may be formed inside the gate insulating film 6 or at an interface of the gate insulating film 6 with the channel region 5.

When gate threshold voltage is $V_{th}$ and the channel depth is D, the following equation (6) is obtained.

$$D = \sqrt{\frac{2\varepsilon_0 \varepsilon_S (V_{FB} - V_{th})}{qN_D}} \tag{6}$$

The following equation (7) is obtained by transforming the equation (6).

$$V_{th} = V_{FB} - (D^2 q N_D)/(2\varepsilon_s \varepsilon_0) \tag{7}$$

$V_{FB}$ in the equation (7) is obtained using the above equation (5).

As described above, according to the present embodiment, it is possible to appropriately control the gate threshold voltage $V_{th}$ of the FET 1 by using the above equation (7). In the present embodiment, the gate threshold voltage $V_{th}$ is controlled to be not less than 4.5V by adjusting each parameter.

In this regard, switch operation cannot be performed when the gate threshold voltage $V_{th}$ is larger than power supply voltage supplied to the FET 1. Therefore, the gate threshold voltage $V_{th}$ should be not more than the power supply voltage supplied to the FET 1. That is, the gate threshold voltage $V_{th}$ should be not less than 4.5V and not more than the power supply voltage.

Meanwhile, when Al$_2$O$_3$ is used as the gate insulating film 6, the thickness of the gate insulating film 6 is desirably not less than 5 nm and not more than 140 nm. The reason for this will be described later in reference to FIG. 6. Alternatively, another dielectric film formed of SiO$_2$ or HfO$_2$, etc., may be used as the gate insulating film 6. In this case, the thickness of the gate insulating film 6 is not less than $5 \times (\varepsilon_{s\_x}/\varepsilon_{s\_a})$ nm and not more than $140 \times (\varepsilon_{s\_x}/\varepsilon_{s\_a})$ nm, where a relative permittivity of such a dielectric film is $\varepsilon_{s\_x}$ and a relative permittivity of Al$_2$O$_3$ is $\varepsilon_{s\_a}$.

(Modification)

Figure 4:
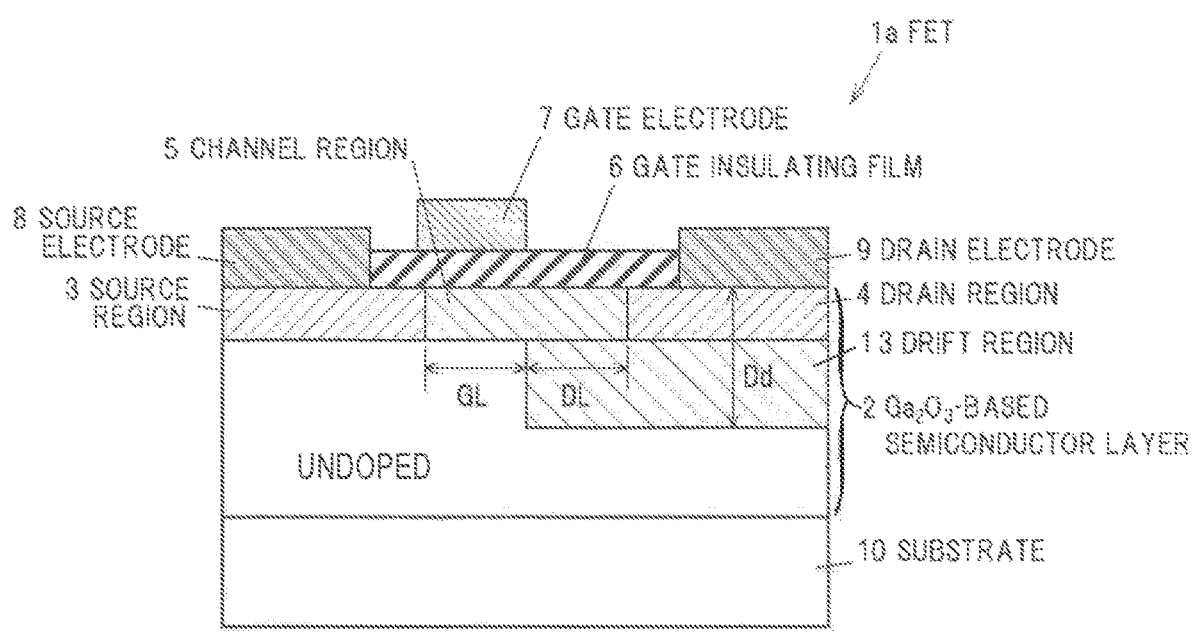
FIG. 4 is a vertical cross-sectional view showing a field-effect transistor (PET) in a modification of the invention.

A FET 1a shown in FIG. 4 has a configuration in which a drift region 13, which is formed in the Ga$_2$O$_3$-based semiconductor layer 2 layer in a region in contact with the channel region 5 and the drain region 4, is further provided in the FET 1 of FIG. 1A. The drift region 13 is formed by doping the Ga$_2$O$_3$-based semiconductor layer 2 layer in a region in contact with the channel region 5 and the drain region 4, with an n-type impurity by ion implantation, etc.

By providing the drift region 13 and expanding the depletion layer 12 between gate and drain, it is possible to suppress the short-gate effect, reduce a leakage current between the source and the drain, improve drain saturation current characteristics, and increase withstand voltage when the source-drain current is cut off. It is also possible to suppress a thickness Dd of the drift region 13 by increasing a donor carrier concentration in the drift region 13.

(Demonstration)

The PET 1 of FIG. 1A using 20 nm-thick Al$_2$O$_3$ as the gate insulating film 6 and the FET 1a of FIG. 4 using 40 nm-thick Al$_2$O$_3$ as the gate insulating film 6 were manufactured by way of trial. The gate insulating film 6 was formed by ALD (atomic layer deposition) in both the FETs 1 and 1a. The gate electrode 7 was formed by depositing Au on Ni and the work function potential difference $\varphi_{MS}$ was 1.2V. The donor carrier concentration in the source region 3 and the drain region 4 was $3 \times 10^{19}$ cm$^{-3}$, the donor carrier concentration in the channel region 5 was $5 \times 10^{17}$ cm$^{-3}$, the gate length GL was 1 μm, and the channel depth D was 45 nm. In addition, in the FET 1a, a length DL of the drift region 13 was 5 μm and the thickness Dd of the drift region 13 was 105 nm.

Figure 5A:
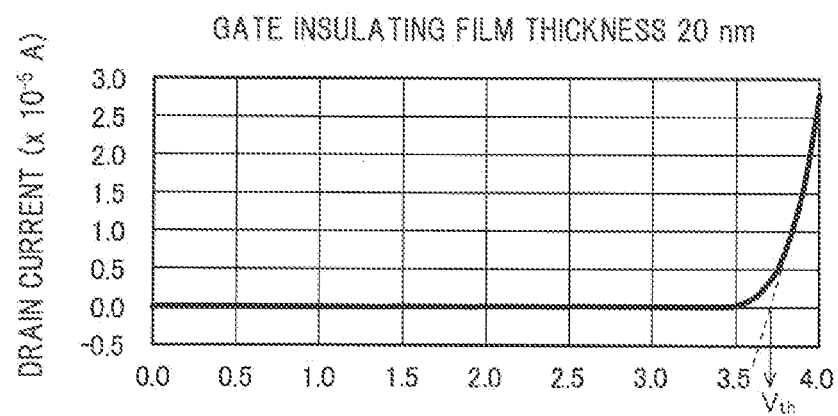
FIG. 5A is a diagram illustrating a measurement result of drain current-gate voltage curve when the field-effect transistor (FET) of FIG. 1A is manufactured by way of trial.

The measurement result of drain current-gate voltage curve of the trial FET 1 is shown in FIG. 5A. As can be seen from FIG. 5A, the measurement result of the gate threshold voltage $V_{th}$ was 3.7V. The gate threshold voltage $V_{th}$ is a value of gate voltage when an asymptote of the drain current (a broken line in the drawing) in the drain current-gate voltage curve is at zero drain current (at a position intersecting with a line of drain current=0). From this result, it was found that a charge density of the interface charge 11 is $8.50\times10^{12}$/eVcm². The gate threshold voltage $V_{th}$ of the FET 1a obtained by the above equation (7) using the obtained charge density of the interface charge 11 was 7.5V.

Figure 5B:
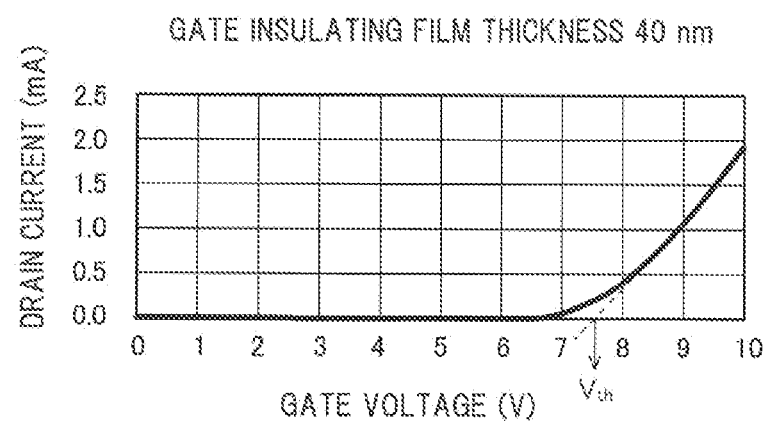
FIG. 5B is a diagram illustrating a measurement result of drain current-gate voltage curve when the field-effect transistor (FET) of FIG. 4 is manufactured by way of trial.

Meanwhile, the measurement result of drain current-gate voltage curve of the trial FET 1a is as shown in FIG. 5B. As can be seen from FIG. 5B, the measurement result of the gate threshold voltage $V_{th}$ was 7.5V which is substantially the same result as the value obtained by calculation (7.5V).

(Method for Designing a Field-Effect Transistor)

In the method for designing a field-effect transistor in the present embodiment, the gate threshold voltage $V_{th}$ is determined using the above equation (7) while taking into consideration at least the interface charge 11 and the thickness and relative permittivity of the gate insulating film 6. In more detail, in the method for designing a field-effect transistor in the present embodiment, the gate threshold voltage $V_{th}$ is controlled using at least any one of the thickness of the gate insulating film 6, the relative permittivity of the gate insulating film 6, the donor carrier concentration in the channel region 5, and the channel depth of the channel region 5.

In particular, firstly, a metal used for the gate electrode 7 should be selected to determine the work function potential difference $\varphi_{MS}$. At this time, when the selection is made so that the flat-band voltage $V_{FB}$ represented by the above equation (5) is large, it is easy to adjust the gate threshold voltage $V_{th}$, hence, a metal with a high work function is preferably selected.

The effective interface charge $Q_{it}$ per unit area of $Ga_2O_3$ is larger than that of other semiconductors but varies depending on a plane on which the gate insulating film 6 is provided. When the gate insulating film 6 is provided on a (010) plane of $Ga_2O_3$, the interface charge 11 is maximum, the charge density is $8.50\times10^{12}$/eVcm², and $Q_{it}$ is $1.36\times10^2$ C/cm². Meanwhile, when the gate insulating film 6 is provided on a (100) plane of $Ga_2O_3$, the value of $Q_{it}$ is halved and changes proportional to the angle between the (100) plane as 0° and the (010) plane as 90°. The charge density of the interface charge 11 is, e.g., not less than $1.00\times10^{11}$/eVcm² and not more than $1.00\times10^{13}$/eVcm².

It is also possible to increase the gate threshold voltage $V_{th}$ by reducing the capacitance $C_{ox}$ per unit area of the gate insulating film 6, i.e., by increasing the thickness of the gate insulating film 6, but transconductance decreases. Therefore, it is necessary to select a thickness that can withstand voltage between the gate and the source. It is more preferable that, in addition to this, the gate threshold voltage $V_{th}$ is adjusted by the donor carrier concentration $N_D$ in the channel region and the channel depth D. Particularly, the channel depth D changes such that its value is raised to the second power (see the equation (7)), and the effect is large.

Although the density of the interface charge 11 varies depending on the plane orientation of $Ga_2O_3$ on which the gate insulating film 6 as described above, it is predictable and it is possible to know the density of the interface charge 11 in advance by making a trial product. Then, by selectively changing any of the donor carrier concentration $N_D$ in the channel region 5, the channel depth D, the thickness of the gate insulating film 6 and the relative permittivity of the gate insulating film 6, it is possible to achieve a desired gate threshold voltage $V_{th}$. Next, change in the gate threshold voltage $V_{th}$ when changing these parameters will be examined.

Firstly, the gate threshold voltage $V_{th}$, the maximum current, the flat-band voltage $V_{FB}$ and transconductance gm at a drain current of 1 mA when using $SiO_2$, $Al_2O_3$ and $HfO_2$ as the gate insulating film 6 were calculated to examine an effect of the material of the gate insulating film 6. The calculation conditions were as follows: the structure of FIG. 1A was used, the gate electrode 7 was formed by depositing Au on Ni, and the work function potential difference ($N_s$ was 1.2V. The donor carrier concentration in the source region 3 and the drain region 4 was $3\times10^{19}$ cm⁻³, the donor carrier concentration in the channel region 5 was $5\times10^{17}$ cm⁻³, the gate length GL was 3 μm, and the channel depth D was 45 nm. In addition, the substrate 10 formed of a $Ga_2O_3$-based single crystal doped with Fe was used and the $Ga_2O_3$-based semiconductor layer 2 was formed on the (010) plane of the substrate 10. The results are shown in Table 1.

TABLE 1

| Type of Gate insulating film | $SiO_2$ | $Al_2O_3$ | $HfO_2$ |
| --- | --- | --- | --- |
| Relative permittivity | 3.9 | 8.1 | 20 |
| Dielectric film breakdown voltage (V/cm) | $1.20 \times 10^7$ | $6.00 \times 10^6$ | $5.00 \times 10^6$ |
| Gate threshold voltage $V_{th}$ (V) | 6.75 | 3.5 | 1.53 |
| Maximum current (mA) | 1.4 | 1.4 | 1.4 |
| Flat-band voltage $V_{FB}$ (V) | 7.7 | 4.63 | 2.65 |
| gm (S) at drain current of 1 mA | $2.41 \times 10^{-3}$ | $2.41 \times 10^{-3}$ | $2.41 \times 10^{-3}$ |

According to Table 1, the effect of the material of the gate insulating film 6 is only the change in the gate threshold voltage $V_{th}$ and the gate threshold voltage $V_{th}$ due to a difference in relative permittivity. In other words, it is possible to control the gate threshold voltage $V_{th}$ by the relative permittivity of the gate insulating film 6. Since the gate threshold voltage $V_{th}$ is high with $SiO_2$, $SiO_2$ is suitable for power devices, etc., required to have a high gate threshold voltage $V_{th}$. On the other hand, $HfO_2$ is suitable for applications requiring a low gate threshold voltage $V_{th}$, such as digital circuits.

Next, the gate threshold voltage $V_{th}$, etc., when using $Al_2O_3$ as the gate insulating film 6 were calculated while changing the thickness of the gate insulating film 6. The other conditions, etc., were the same as for Table 1. The results are shown in Table 2 and FIG. 6.

TABLE 2

| Thickness of Gate insulating film (nm) | 5 | 10 | 20 | 30 | 40 | 50 | 60 |
| --- | --- | --- | --- | --- | --- | --- | --- |
| Gate threshold voltage $V_{th}$ (V) | 0.979 | 1.85 | 3.5 | 5.01 | 6.38 | 7.61 | 8.7 |
| Maximum current (mA) | 1.4 | 1.4 | 1.4 | 1.4 | 1.4 | 1.4 | 1.4 |
| Flat-band voltage $V_{FB}$ (V) | 2.11 | 2.98 | 4.63 | 6.14 | 7.51 | 8.74 | 9.83 |
| gm (×10⁻³S) at drain current of 1 mA | 2.41 | 2.41 | 2.41 | 2.41 | 2.41 | 2.41 | 2.41 |
| Thickness of Gate insulating film (nm) | 70 | 80 | 90 | 100 | 120 | 140 | 160 |
| Gate threshold voltage $V_{th}$ (V) | 9.66 | 10.5 | 11.2 | 11.7 | 12.4 | 12.5 | 12.1 |
| Maximum current (mA) | 1.4 | 1.4 | 1.4 | 1.4 | 1.4 | 1.4 | 1.4 |

TABLE 2-continued

| | | | | | | | |
|---|---|---|---|---|---|---|---|
| Flat-band voltage $V_{FB}$ (V) | 10.8 | 11.6 | 12.3 | 12.8 | 13.5 | 13.6 | 13.2 |
| gm (×10⁻³S) at drain current of 1 mA | 2.41 | 2.41 | 2.41 | 2.41 | 2.41 | 2.41 | 2.41 |

Figure 6:
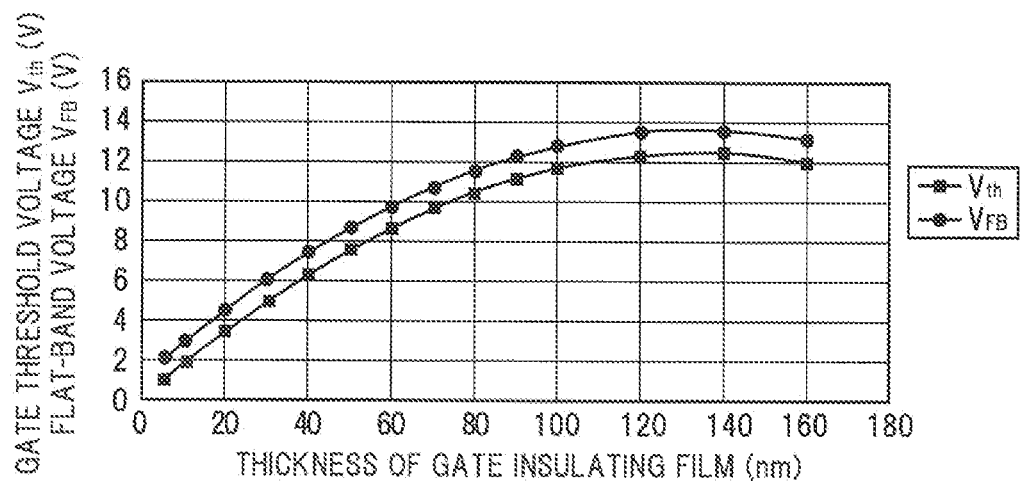
FIG. 6 is a diagram illustrating gate threshold voltage and flat-band voltage of the field-effect transistor (FET) of FIG. 1A that are obtained when a thickness of the gate insulating film is changed.

As shown in Table 2 and FIG. 6, the gate threshold voltage $V_{th}$ and the flat-band voltage $V_{FB}$ increase with an increase in the thickness of the gate insulating film 6. That is, it is possible to control the gate threshold voltage $V_{th}$ by controlling the thickness of the gate insulating film 6. In this regard, however, when the thickness of the gate insulating film 6 is too large (in particular, more than 140 nm), the equivalent dielectric film effect (the effect by the equivalent thickness of the gate insulating film 6 when having a $Ga_2O_3$ relative permittivity of 10) increases, and the values of the gate threshold voltage $V_{th}$ and the flat-band voltage $V_{FB}$ saturate (or decrease). Therefore, the thickness of the gate insulating film 6 is desirably not less than 5 nm and not more than 140 nm.

Since the flat-band voltage $V_{FB}$ is calculated using a calculating formula for the depletion mode, it is calculated up to the point where the depletion layer 12 in the channel region 5 disappears, and the drain current is supposed to saturate. In reality, when gate voltage higher than the flat-band voltage $V_{FB}$ is applied, electrons are drawn from the $n^+$ regions (the source region 3 and the drain region 4) and gather in the channel region 5, this makes as if the donor carrier concentration in the channel region 5 has risen, and the drain current continuously increases and gradually saturates (storage effect). At this time, it looks as if the flat-band voltage $V_{FB}$ is increased by about 1V-2V, although depending on the shape of the FET 1.

Next, the gate threshold voltage $V_{th}$, etc., when using 40 nm-thick $Al_2O_3$ as the gate insulating film 6 were calculated while changing the donor carrier concentration in the channel region 5. The other conditions, etc., were the same as for Table 1. The results are shown in Table 3 and drain current-gate voltage curves are shown in FIG. 7.

TABLE 3

| Donor carrier concentration $N_D$ (/cm³) in Channel region | $1.00 \times 10^{17}$ | $2.00 \times 10^{17}$ | $3.00 \times 10^{17}$ | $4.00 \times 10^{17}$ | $5.00 \times 10^{17}$ |
|---|---|---|---|---|---|
| Gate threshold voltage $V_{th}$ (V) | 8.16 | 7.71 | 7.27 | 6.82 | 6.38 |
| Maximum current (A) | $5.55 \times 10^{-5}$ | $2.23 \times 10^{-4}$ | $5.04 \times 10^{-4}$ | $8.97 \times 10^{-4}$ | $1.40 \times 10^{-3}$ |
| Flat-band voltage $V_{FB}$ (V) | 8.39 | 8.17 | 7.59 | 7.73 | 7.51 |
| gm (×10⁻³S) at drain current of 1 mA | Not reaching 1 mA | Not reaching 1 mA | Not reaching 1 mA | Not reaching 1 mA | 2.41 |
| gm (×10⁻³S) at maximum drain current | 0.595 | 1.19 | 1.78 | 2.38 | 2.97 |
| Donor carrier concentration $N_D$ (/cm³) in Channel region | $6.00 \times 10^{17}$ | $7.00 \times 10^{17}$ | $8.00 \times 10^{17}$ | $9.00 \times 10^{17}$ | $1.00 \times 10^{18}$ |
| Gate threshold voltage $V_{th}$ (V) | 5.93 | 5.48 | 5.04 | 4.59 | 4.14 |
| Maximum current (A) | $2.02 \times 10^{-3}$ | $2.75 \times 10^{-3}$ | $3.59 \times 10^{-3}$ | $4.55 \times 10^{-3}$ | $5.61 \times 10^{-3}$ |
| Flat-band voltage $V_{FB}$ (V) | 7.28 | 7.06 | 6.84 | 6.62 | 6.4 |
| gm (×10⁻³S) at drain current of 1 mA | 2.18 | 2.15 | 2.05 | 2.03 | 1.97 |
| gm (×10⁻³S) at maximum drain current | 3.57 | 4.16 | 4.76 | 5.35 | 5.95 |

Figure 7:
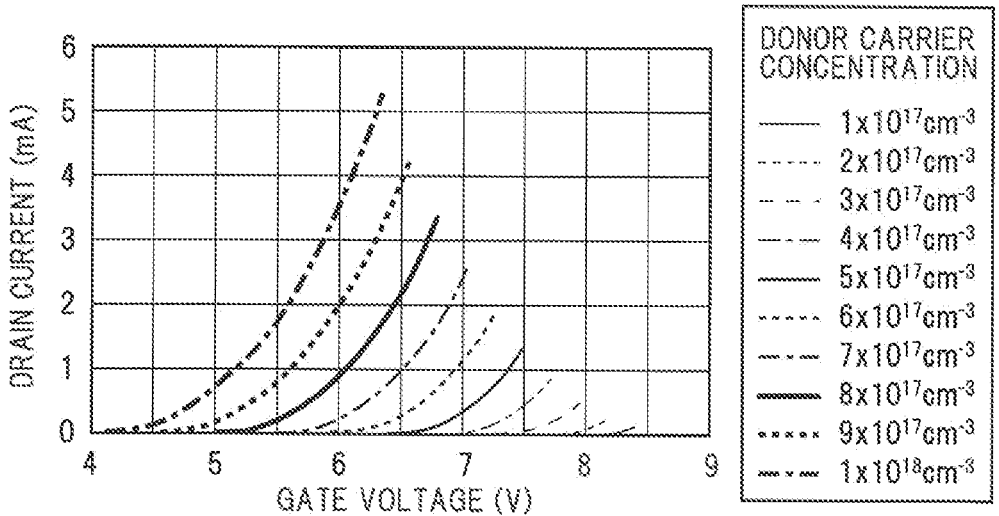
FIG. 7 is a diagram illustrating drain current-gate voltage curves of the field-effect transistor (FET) of FIG. 1A that are obtained when a donor carrier concentration in a channel region is changed.

As shown in Table 3 and FIG. 7, the gate threshold voltage $V_{th}$ and the flat-band voltage $V_{FB}$ decrease with an increase in the donor carrier concentration in the channel region 5. That is, it is possible to control the gate threshold voltage $V_{th}$ by the donor carrier concentration in the channel region 5.

Next, the gate threshold voltage $V_{th}$, etc., when using 40 nm-thick $Al_2O_3$ as the gate insulating film 6 and having the donor carrier concentration of $5\times10^{17}$ cm$^{-3}$ in the channel region 5 were calculated while changing the channel depth D (ion implantation depth). The other conditions, etc., were the same as for Table 1. The results are shown in Table 4 and drain current-gate voltage curves are shown in FIG. 8.

TABLE 4

| Channel depth (nm) | 10 | 20 | 30 | 40 | 50 |
|---|---|---|---|---|---|
| Gate threshold voltage $V_{th}$ (V) | 7.46 | 7.32 | 7.1 | 6.78 | 6.38 |
| Maximum current (A) | $1.06 \times 10^{-5}$ | $8.85 \times 10^{-5}$ | $3.01 \times 10^{-4}$ | $7.17 \times 10^{-4}$ | $1.40 \times 10^{-3}$ |
| Flat-band voltage $V_{FB}$ (V) | 7.51 | 7.51 | 7.51 | 7.51 | 7.51 |
| gm ($\times 10^{-3}$S) at drain current of 1 mA | Not reaching 1 mA | Not reaching 1 mA | Not reaching 1 mA | Not reaching 1 mA | 2.41 |
| gm ($\times 10^{-3}$S) at maximum drain current | 0.595 | 1.19 | 1.78 | 2.38 | 2.97 |
| Channel depth (nm) | 60 | 70 | 80 | 90 | 100 |
| Gate threshold voltage $V_{th}$ (V) | 5.88 | 5.29 | 4.61 | 3.85 | 2.99 |
| Maximum current (A) | $2.42 \times 10^{-3}$ | $3.85 \times 10^{-3}$ | $5.75 \times 10^{-3}$ | $8.19 \times 10^{-3}$ | $1.12 \times 10^{-2}$ |
| Flat-band voltage $V_{FB}$ (V) | 7.51 | 7.51 | 7.51 | 7.51 | 7.51 |
| gm ($\times 10^{-3}$S) at drain current of 1 mA | 1.95 | 1.69 | 1.58 | 1.41 | 1.31 |
| gm ($\times 10^{-3}$S) at maximum drain current | 3.57 | 4.16 | 4.76 | 5.35 | 5.95 |

Figure 8:
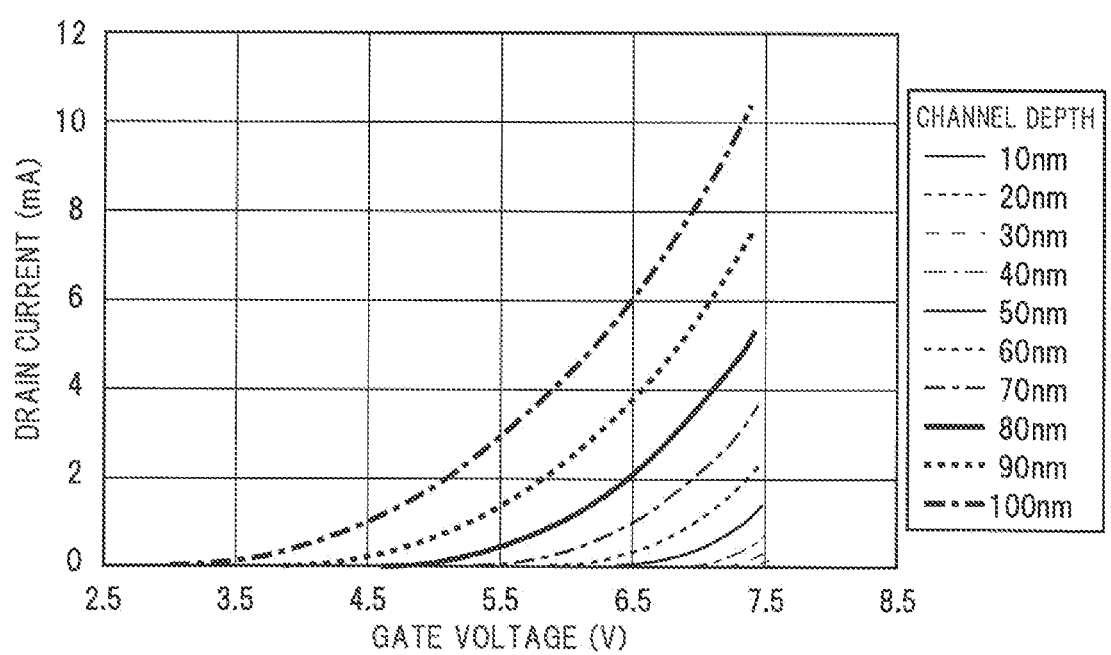
FIG. 8 is a diagram illustrating drain current-gate voltage curves of the field-effect transistor (FET) of FIG. 1A that are obtained when the channel depth D is changed.

As shown in Table 4 and FIG. 8, the gate threshold voltage $V_{th}$ decreases with an increase in the channel depth D. That is, it is possible to control the gate threshold voltage $V_{th}$ by the channel depth D. Comparison between Table 4 and Table 3 described above shows that there is no change in the flat-band voltage $V_{FB}$ when changing the channel depth D, unlike when changing the donor carrier concentration in the channel region 5.

Next, the device having the structure of FIG. 4 provided with the drift region 13 was examined. 40 nm-thick $Al_2O_3$ was used as the gate insulating film 6. The donor carrier concentration in the channel region 5 was $5\times10^{16}$ cm$^{-3}$. The donor carrier concentration in the drift region 13 in power device is often reduced to ensure withstand voltage. Therefore, in view of this point, the donor carrier concentration in the drift region here was set to $5\times10^{17}$ cm$^{-3}$. The length DL of the drift region 13 was 5.1 μm. The other conditions were the same as for Table 1. The results of calculating the gate threshold voltage $V_{th}$, etc., while changing the channel depth D are shown in Table 5 and drain current-gate voltage curves are shown in FIG. 9.

TABLE 5

| Channel depth (nm) | 100 | 150 | 200 | 250 | 300 |
|---|---|---|---|---|---|
| Gate threshold voltage $V_{th}$ (V) | 8.04 | 7.48 | 6.69 | 5.67 | 4.43 |
| Maximum current (A) | $1.12 \times 10^{-4}$ | $3.78 \times 10^{-4}$ | $8.98 \times 10^{-4}$ | $1.76 \times 10^{-3}$ | $3.03 \times 10^{-3}$ |
| Flat-band voltage $V_{FB}$ (V) | 8.5 | 8.5 | 8.5 | 8.5 | 8.5 |
| gm ($\times 10^{-3}$S) at drain current of 1 mA | Not reaching 1 mA | Not reaching 1 mA | Not reaching 1 mA | 1.01 | 0.868 |
| gm ($\times 10^{-3}$S) at maximum drain current | 0.595 | 0.892 | 1.19 | 1.49 | 1.78 |
| Channel depth (nm) | 350 | 400 | 450 | 500 | |
| Gate threshold voltage $V_{th}$ (V) | 2.96 | 1.27 | −0.652 | −2.8 | |
| Maximum current (A) | $4.82 \times 10^{-3}$ | $7.19 \times 10^{-3}$ | $1.02 \times 10^{-2}$ | $1.39 \times 10^{-2}$ | |
| Flat-band voltage $V_{FB}$ (V) | 8.5 | 8.5 | 8.5 | 8.5 | |
| gm ($\times 10^{-3}$S) at drain current of 1 mA | 0.74 | 0.679 | 0.645 | 0.591 | |
| gm ($\times 10^{-3}$S) at maximum drain current | 2.08 | 2.38 | 2.68 | 2.84 | |

Figure 9:
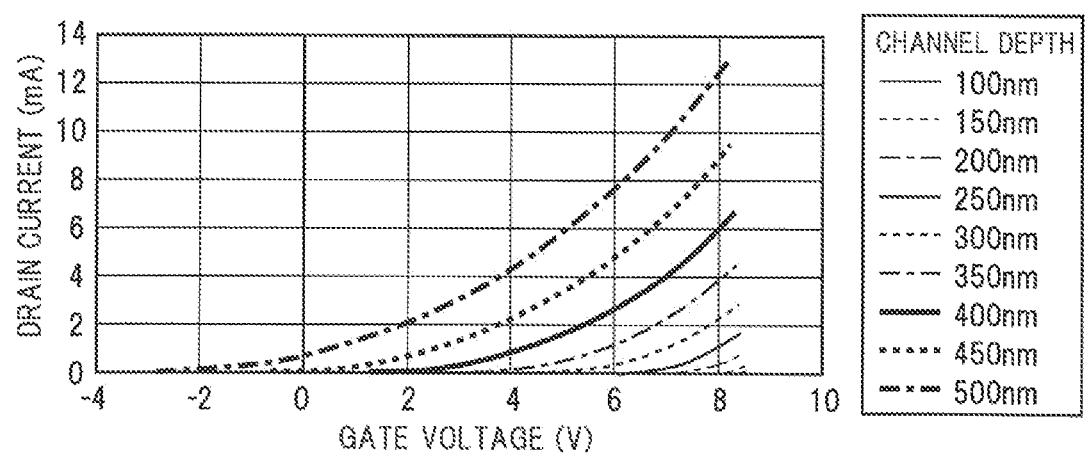
FIG. 9 is a diagram illustrating drain current-gate voltage curves of the field-effect transistor (FET) of FIG. 4 that are obtained when the channel depth D is changed.

As shown in Table 5 and FIG. 9, the gate threshold voltage $V_{th}$ decreases with an increase in the channel depth D and it is possible to control the gate threshold voltage $V_{th}$ by the channel depth D also when having the structure of FIG. 4. The channel depth D can be set to be deeper than that in the structure of FIG. 1A by reducing the donor carrier concentration in the drift region 13 and this facilitates a cutting process such as etching when forming a three-dimensional structure as shown in FIG. 1A of Patent Literature 1. Although the gate threshold voltage when having the channel depth D of 500 nm is negative in Table 5 and it is normally-on, it is possible to achieve, e.g., the gate threshold voltage of 4.8V and normally-off by using 80 nm-thick $Al_2O_3$ as the gate insulating film 6.

Functions and Effects of the Embodiment

As described above, the field-effect transistor 1 in the present embodiment is a field-effect transistor using a $Ga_2O_3$-based semiconductor in which the interface charge 11 consisting of a negative charge is formed between the gate electrode 7 and the channel region 5 and the gate threshold voltage $V_{th}$ of not less than 4.5V is achieved by controlling the gate threshold voltage $V_{th}$ while taking into consideration the interface charge 11 and the thickness and relative permittivity of the gate insulating film 6.

The field-effect transistor 1 uses a $Ga_2O_3$-based semiconductor and thus can be used in a high-temperature environment or in a radiation exposure environment. In addition, it is possible to realize normally-on operation of the field-effect transistor 1 and thereby improve safety when used for power devices, etc. Furthermore, the field-effect transistor 1 can have the gate threshold voltage $V_{th}$ of not less than 4.5V that is the same level as currently available power devices using Si or SiC, and it is possible to suppress malfunction and to enhance versatility.

Although the embodiment of the invention has been described, the invention is not limited to the embodiment, and the various kinds of modifications can be implemented without departing from the gist of the invention. For example, the lateral FET has been described in the embodiment, the invention is applicable to vertical FETs.

In addition, the embodiment does not limit the invention according to claims. Further, please note that all combinations of the features described in the embodiment are not necessary to solve the problem of the invention.

REFERENCE SIGNS LIST 1, 1a FET (FIELD-EFFECT TRANSISTOR)
2 $Ga_2O_3$-BASED SEMICONDUCTOR LAYER
3 SOURCE REGION
4 DRAIN REGION
5 CHANNEL REGION
6 GATE INSULATING FILM
7 GATE ELECTRODE
8 SOURCE ELECTRODE
9 DRAIN ELECTRODE
10 SUBSTRATE
11 INTERFACE CHARGE
12 DEPLETION LAYER
13 DRIFT REGION

The invention claimed is:

1. A field-effect transistor for normally-off operation, comprising:
a $Ga_2O_3$-based semiconductor layer that is formed of a β-type $Ga_2O_3$-based single crystal;
a source region and a drain region that are formed inside the $Ga_2O_3$-based semiconductor layer and are n-type regions doped with an n-type impurity;
a channel region which is continuous between the source region and the drain region and located inside the $Ga_2O_3$-based semiconductor layer, the channel region that is an n-region doped with an n-type impurity and has n-type conductivity weaker than the source and the drain regions;
an undoped region located inside the $Ga_2O_3$-based semiconductor layer and below the source, the drain and the channel regions, the undoped region that does not contain any intentionally doped impurity and has insulating properties or has an n-type conductivity weaker than the channel region;
a gate insulating film that is formed directly on a surface of the $Ga_2O_3$-based semiconductor layer so as to be in contact with the channel region;
a gate electrode that is formed, via the gate insulating film, on the channel region;
a source electrode connected to the source region; and
a drain electrode connected to the drain region,
wherein an interface charge comprising a negative charge is formed on a surface or in an upper portion of the channel region, and
wherein a gate threshold voltage is not less than 4.5V and not more than power supply voltage.

2. The field-effect transistor for normally-off operation according to claim 1, wherein a donor carrier concentration in the channel region is not less than $1\times10^{15}$ cm$^{-3}$ and not more than $1\times10^{18}$ cm$^{-3}$.

3. The field-effect transistor for normally-off operation according to claim 1, wherein a depth of the channel region is not less than 10 nm and not more than 3 μm.

4. The field-effect transistor for normally-off operation according to claim 1, wherein the gate insulating film comprises $Al_2O_3$ and has a thickness of not less than 5 nm and not more than 140 nm.

5. The field-effect transistor for normally-off operation according to claim 1, further comprising:
a drift region formed in the $Ga_2O_3$-based semiconductor layer in a region in contact with the channel region and the drain region.

6. The field-effect transistor for normally-off operation according to claim 1, wherein the $Ga_2O_3$-based semiconductor layer is formed on a substrate that comprises any of $Ga_2O_3$, AlN, SiC, diamond, sapphire, Si, $SiO_2$, $Si_3N_4$ or BN.

7. A field-effect transistor for normally-off operation, comprising:
a $Ga_2O_3$-based semiconductor layer that is formed of a p-type $Ga_2O_3$-based single crystal;
a source region and a drain region that are formed inside the $Ga_2O_3$-based semiconductor layer and are n-type regions doped with an n-type impurity;
a channel region which is continuous between the source region and the drain region and located inside the $Ga_2O_3$-based semiconductor layer, the channel region that is an n-region doped with an n-type impurity and has n-type conductivity weaker than the source and the drain regions;
an undoped region located inside the $Ga_2O_3$-based semiconductor layer and below the source, the drain and the channel regions, the undoped region that does not contain any intentionally doped impurity and has insulating properties or has an n-type conductivity weaker than the channel region;

a gate insulating film that is formed directly on a surface of the $Ga_2O_3$-based semiconductor layer so as to be in contact with the channel region;

a gate electrode that is formed, via the gate insulating film, on the channel region;

a source electrode connected to the source region; and a drain electrode connected to the drain region, wherein an interface charge comprising a negative charge is formed on a surface or in an upper portion of the channel region, and the field-effect transistor has a gate threshold voltage in a range of not less than 4.5V and not more than power supply voltage that is determined taking into consideration at least the interface charge and a thickness and a relative permittivity of the gate insulating film.

8. The field-effect transistor for normally-off operation according to claim 7, wherein the field-effect transistor has a gate threshold voltage that is controlled using at least any one of the thickness of the gate insulating film, the relative permittivity of the gate insulating film, a donor carrier concentration in the channel region, and a channel depth of the channel region.

9. A method for designing a field-effect transistor for normally-off operation comprising a $Ga_2O_3$-based semiconductor layer that is formed of a β-type $Ga_2O_3$-based single crystal, a source region and a drain region that are formed inside the $Ga_2O_3$-based semiconductor layer and are n-type regions doped with an n-type impurity, a channel region which is continuous between the source region and the drain region and located inside the $Ga_2O_3$-based semiconductor layer, the channel region that is an n-region doped with an n-type impurity and has n-type conductivity weaker than the source and the drain regions, an undoped region located inside the $Ga_2O_3$-based semiconductor layer and below the source, the drain and the channel regions, the undoped region that does not contain any intentionally doped impurity and has insulating properties or has an n-type conductivity weaker than the channel region, a gate insulating film that is formed directly on a surface of the $Ga_2O_3$-based semiconductor layer so as to be in contact with the channel region, a gate electrode that is formed, via the gate insulating film, on the channel region, a source electrode connected to the source region, and a drain electrode connected to the drain region, the method comprising:

forming an interface charge comprising a negative charge on a surface or in an upper portion of the channel region; and determining a gate threshold voltage in a range of not less than 4.5V and not more than power supply voltage taking into consideration at least the interface charge and a thickness and a relative permittivity of the gate insulating film.

10. The method according to claim 9, comprising:

controlling a gate threshold voltage using at least any one of the thickness of the gate insulating film, the relative permittivity of the gate insulating film, a donor carrier concentration in the channel region, and a channel depth of the channel region.

* * * * *